United States Patent [19]

Murakami et al.

[11] Patent Number: 4,875,013
[45] Date of Patent: Oct. 17, 1989

[54] HIGH-FREQUENCY COIL FOR NUCLEAR MAGNETIC IMAGING

[75] Inventors: Yoshiki Murakami, Tokyo; Etsuji Yamamoto, Akishima; Masao Yabusaki; Hideki Kohno, both of Tokyo, all of Japan

[73] Assignee: Hitachi, Ltd., Tokyo, Japan

[21] Appl. No.: 162,982

[22] Filed: Mar. 2, 1988

[30] Foreign Application Priority Data

Mar. 13, 1987 [JP] Japan .................................. 62-56524
Jul. 31, 1987 [JP] Japan .................................. 62-192287

[51] Int. Cl.$^4$ ............................................. G01R 33/20
[52] U.S. Cl. ..................................... 324/318; 324/322; 333/219
[58] Field of Search ............... 324/300, 307, 309, 318, 324/319, 322, 315, 316; 333/219

[56] References Cited

U.S. PATENT DOCUMENTS

| | | | |
|---|---|---|---|
| 4,641,097 | 2/1987 | Bottomley et al. | 324/318 |
| 4,740,751 | 4/1988 | Misic et al. | 324/322 |
| 4,748,412 | 5/1988 | Yamamoto | 324/318 |

Primary Examiner—Michael J. Tokar
Attorney, Agent, or Firm—Antonelli, Terry & Wands

[57] ABSTRACT

A high-frequency coil of the type of slot resonator in which outer conductors that have wing portions at both ends thereof and that are divided, are formed on the cylindrical surface, and ring-like inner conductors are formed on the inside of the wing portions. The wing portions have a width different from the width of the inner conductors. The self resonance frequency of the coil is adjusted by adjusting the width which is smaller than the other width. Further, the neighboring tips of the wing portions are opposed to each other via an air gap. The self resonance frequency is also adjusted depending upon the position of the dielectric plate inserted in the gap.

2 Claims, 4 Drawing Sheets

HIGH-FREQUENCY COIL FOR NUCLEAR MAGNETIC IMAGING

FIELD OF INDUSTRY

The present invention relates to an apparatus for imaging the density distribution and relaxation time distribution of nuclei by measuring nuclear magnetic resonance (NMR) signals from hydrogen and phosphorus in the living body. More specifically, the invention relates to a high-frequency coil used for generating or receiving an RF magnetic field.

PRIOR ART

X-ray CT's and ultrasonic imaging devices have heretofore been widely used for non-destructively inspecting the internal structure of human heads and abdomens. In recent years, however, it has been succeeded in performing similar inspection utilizing the nuclear magnetic resonance phenomenon to obtain data that could not be obtained with the existing X-ray CT's or ultrasonic imaging devices. Moreover, the NMR apparatus presents advantage in that data in the living body are obtained by transmitting and receiving electromagnetic waves of a radio-frequency band that affect the living body little.

The signal-to-noise ratio in the nuclear magnetic resonance increases in proportion to the static magnetic field intensity H raised to the power of about one and a half. Therefore, it has been attempted to improve the signal-to-noise ratio by generating a large magnetic field intensity using superconductive magnets.

On the other hand, the frequency of signals to be transmitted and received, i.e., the nuclear magnetic resonance frequency varies in proportion to the static magnetic field intensity H. Therefore, the apparatus with such a large magnetic field must be provided with a coil that has a self resonance frequency. A high-frequency coil adapted to such applications can be represented by a slot resonator or an Alderman and Grant coil that is disclosed in the Journal of Magnetic Resonance, Vol. 36, pp. 447, 1979 or in U.S. Pat. No. 4,641,097.

In the high-frequency coil of this type, outer conductors that are divided into two via a slot, and ring-like inner conductors each being called guard ring are capacity-coupled together via a bobbin composed of a dielectric material. If it is attempted to obtain a high resonance frequency, however, the Q-value of the coil decreases and the efficiency of transmission and reception decreases, too.

SUMMARY OF THE INVENTION

It is an object of the present invention to provide a high-frequency coil which does not permit the Q-value to decrease even when it is attempted to obtain a high resonance frequency and which exhibits a sufficiently high efficiency of RF magnetic field transmission and reception even when the coil is used for a high-static magnetic field NMR apparatus.

Another object of the present invention is to provide a high-frequency coil for NMR imaging that enables the resonance frequency to be easily adjusted.

The high-frequency coil for NMR imaging according to the present invention comprises central band portions that are provided at opposing positions on a cylindrical surface and that are in parallel with the center axis of the cylindrical surface, first and second outer conductors having four wing portions that extend from both ends of the central band portions, and ring-like first and second inner conductors that are provided on the inside of the wing portions of the outer conductors, wherein the inner conductors have a width different from the width of the wing portions.

According to the present invention, furthermore, the tips of wing portions of the first and second outer conductors are opposed to each other via an air gap, and a dielectric means is inserted in the air gap in a manner that the position thereof can be adjusted.

EMBODIMENT

An embodiment of the present invention will now be described in conjunction with the drawings.

Figure 1:
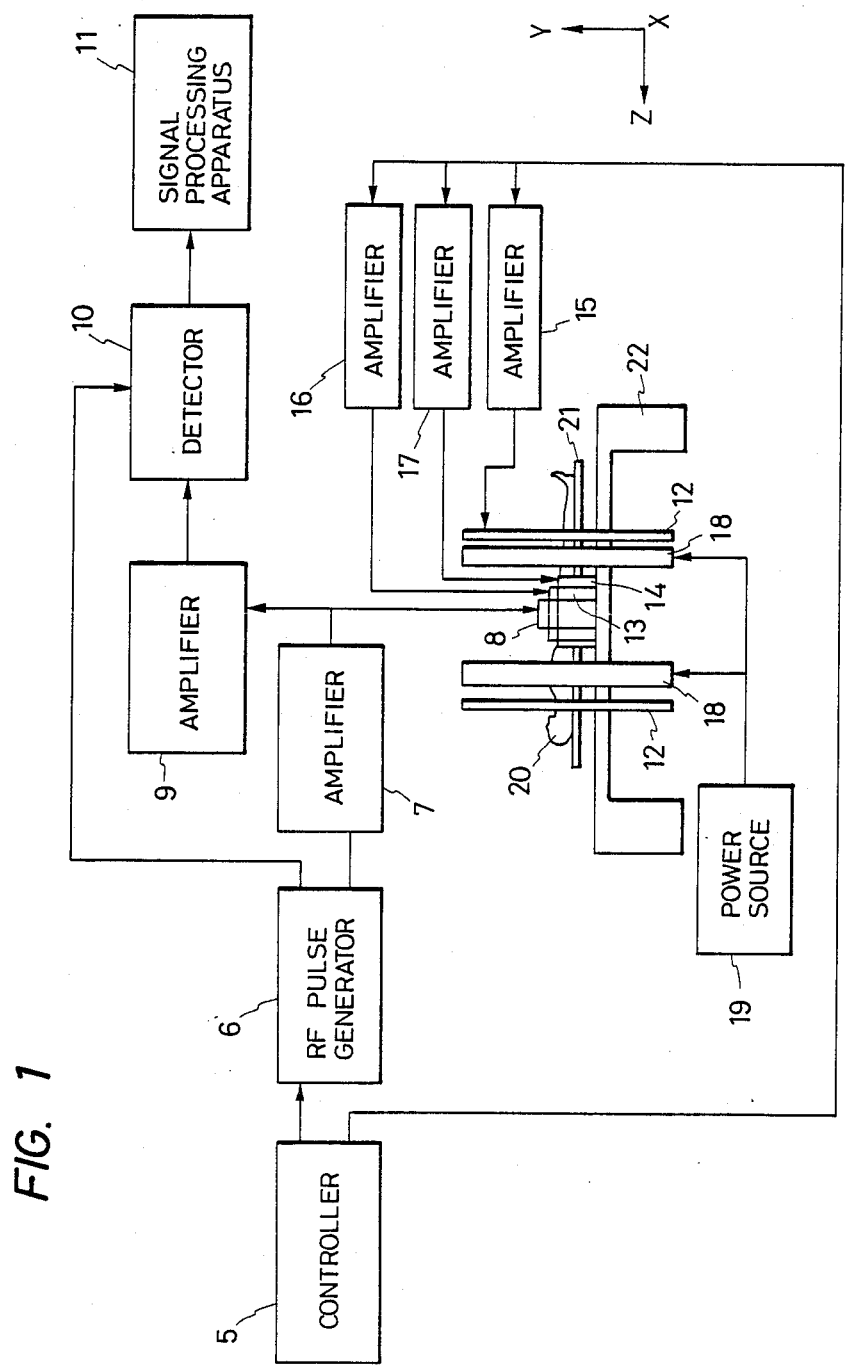
FIG. 1 is a block diagram illustrating the whole NMR apparatus according to an embodiment.

FIG. 1 illustrates the structure of a nuclear magnetic resonance apparatus according to an embodiment of the present invention. A controller 5 sends a variety of instructions at a predetermined timing to various devices. The output of an RF pulse generator 6 is amplified through an amplifier 7 to excite a high-frequency coil 8. A signal component received by the high-frequency coil 8 passes through an amplifier 9, detected by a detector 10, and is then converted into an image by a signal processing apparatus 11. Gradient magnetic fields are generated in the Z-direction and in a direction at right angles thereto by coils 12, 13 and 14 that are driven by amplifiers 15, 16 and 17, respectively. A static magnetic field is generated by a coil 18 that is driven by a power source 19. The coil 14 is constructed in the same manner as the coil 13, and is rotated about the Z-axis by 90° with respect to the coil 13. The coils 13 and 14 generate gradient magnetic fields that meet at right angles with each other.

A human body 20 that is to be inspected is placed on a bed 21 which moves on a support plate 22.

Figure 2A:
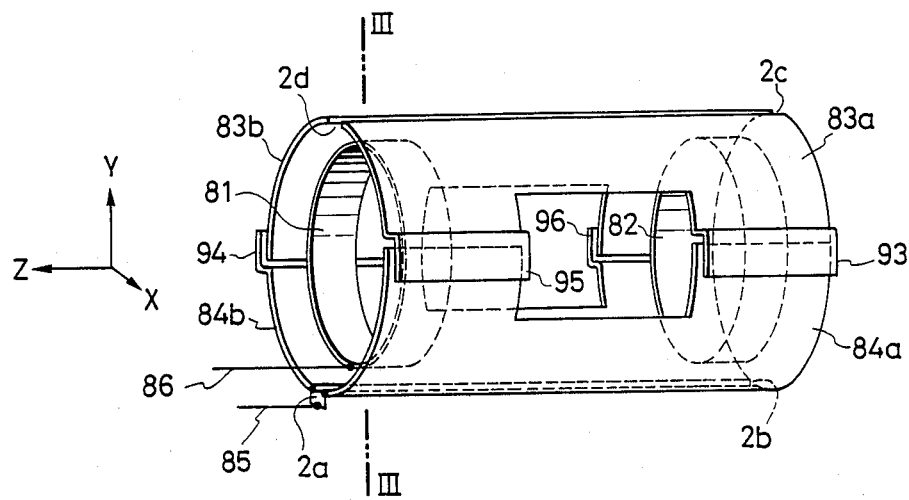
FIGS. 2A, 2B, 2C and 2D are a perspective view, section views and an expansion plan of a high-frequency coil according to the embodiment.
Figure 2B:
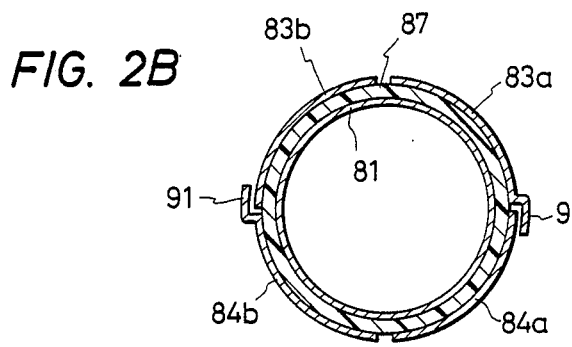
Figure 2C:
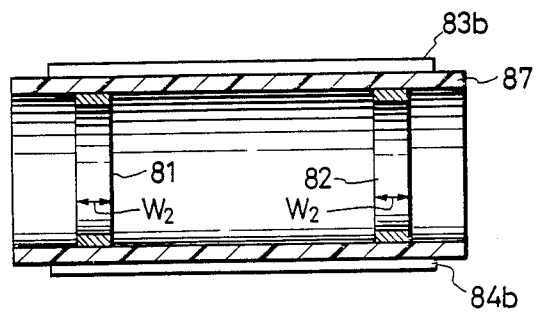
Figure 2D:
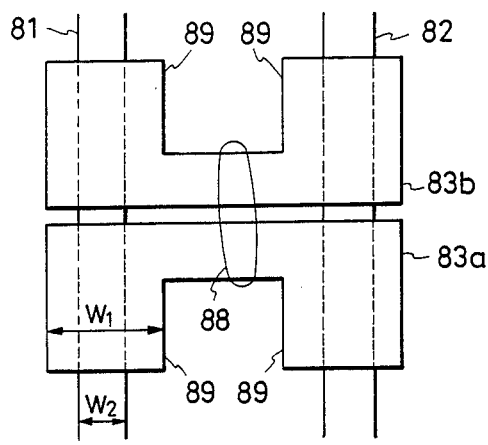

FIGS. 2A to 2D illustrate the above-mentioned high-frequency coil 8 in detail. FIG. 2A is a perspective view of the high-frequency coil which has four outer conductors 83a, 83b, 84a and 84b provided along the cylindrical surface, and two ring-like inner conductors 81 and 82 that are located close thereto. The inner conductors 81 and 82 are often called guard rings. FIG. 2D is an expansion plan illustrating the outer conductors 83a and 83b. The high-frequency coil of this embodiment is also called a slot resonator. In principle, the slot resonator may have the outer conductors 83a and 83b shown in FIG. 2D that are comprised of a single continuous conductor. The conductor has a central band portion designated at 88 and four wing portions 89 that extend from both ends thereof. In this embodiment, however, the outer conductor is divided into two pieces along the center of the band portion to suppress the generation of nonuniform electric currents. Suppression of the nonuniform electric currents have been disclosed in U.S. patent application Ser. No. 016,401 that was filed on Feb. 19, 1987, now Pat. No. 4,748,412. The same also holds true even for the outer conductors 84a and 84b. Namely, the high-frequency coil has four outer conductors as shown in FIG. 2A. Tips of the wing portions are overlapped via an air gap as designated at 93, 94, 95 and 96, so that the outer conductors are capacity-coupled to each other at the tips of the wing portions. The outer conductors and the inner conductors are also capacity-coupled together to establish a current path in which the electric current flows passing through the points 2a-2b-2c-2d (or in the reverse direction). The electric current is supplied to the coil or the signals are taken out from the coil through a cable 85 connected to the two outer conductors 84a and 84b near a point 2a and through a cable 86 connected to the inner conductor 81.

FIG. 2B is a section view of when the coil is cut along the line III—III which is perpendicular to the center axis of cylindrical surface of the coil, and FIG. 2C is a section view of when the coil is cut along the plane that includes the center axis and the points 2a, 2b, 2c and 2d. Though not diagramed in FIG. 2A, the outer conductors 83a, 83b, 84a, 84b and the inner conductors 81 and 82 are provided on the outer wall surface and on the inner wall surface of a cylindrical bobbin made of a dielectric material.

Figure 3:
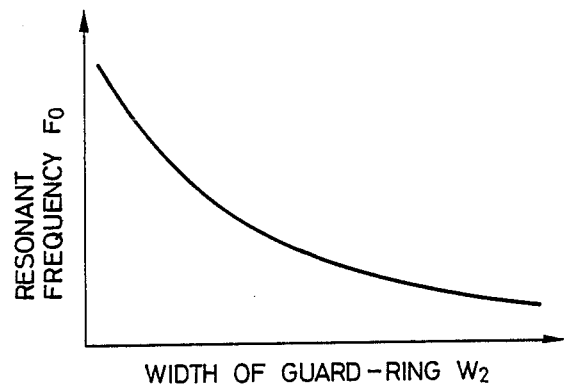
FIGS. 3 and 6 are characteristics diagram showing resonance frequencies of the high-frequency coil.

The feature according to this embodiment resides in that the wings 89 of the outer conductors have a width $w_1$ that is greater than a width $w_2$ of the guard rings 81 and 82. With the guard rings having a reduced width, it is possible to decrease the capacity C without increasing the inductance L and thereby it is made possible to obtain a coil that has a high self resonance frequency $F_0$ and a large Q-value. It is further possible to change the self resonance frequency by simply changing the width of the guard rings. FIG. 3 is a diagram which illustrates the effects, and wherein the abscissa represents the width $w_2$ of the guard rings and the ordinate represents the self resonance frequency $F_0$. As will be understood from FIG. 3, the resonance frequency increases with the decrease in the width of the guard rings. For example, a resonance frequency of 109 MHz is obtained if the width of the guard rings is selected to be 13 mm relative to the wing width of 53 mm. The resonance frequency is increased by more than 20 MHz from 87 MHz of when both of them have the width of 53 mm. When the guard rings have a width of 13 mm, furthermore, the Q-value is increased by 30% compared with when they have the width of 53 mm.

Figure 4:
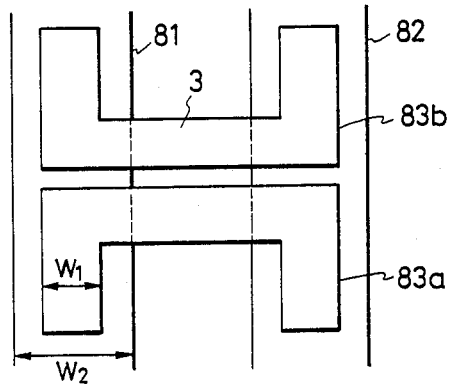
FIG. 4 is an expansion plan of another high-frequency coil.

Contrary to the above-mentioned embodiment, it is also allowable to change the self resonance frequency by changing the width $w_1$ of the wing portions 89 that is selected to be smaller than the width $w_2$ of the guard rings 81, 82. FIG. 4 is a diagram where the outer conductors and the guard rings of the embodiment are expanded into a plan, and wherein the reference numerals denote the same portions as those of FIGS. 2A to 2D.

Figure 5:
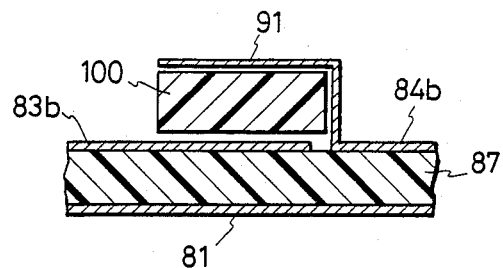
FIGS. 5 and 7 are section views illustrating on an enlarged scale a portion where the wings are overlapped.
Figure 6:
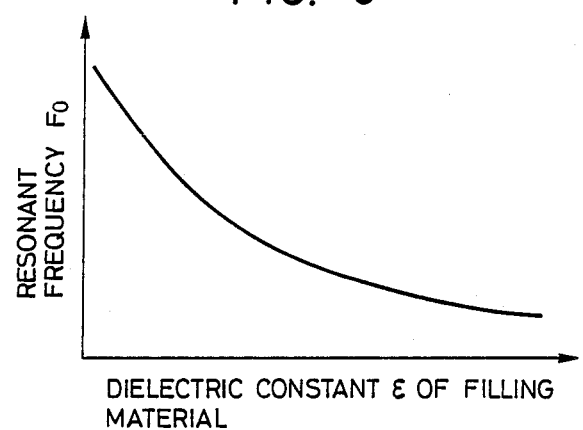
Figure 7:
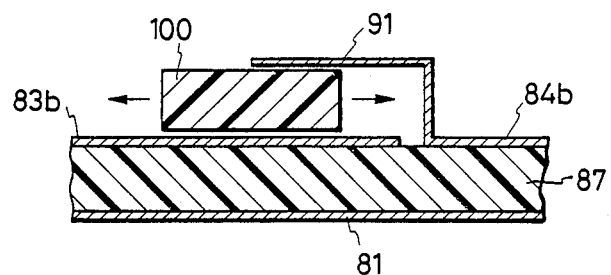

FIG. 5 illustrates on an enlarged scale a portion where tips of the wing portions designated a 91 in FIG. 2D are overlapped upon the other. In FIG. 5, a plate 100 of a dielectric material having a high breakdown voltage is filled in a gap between the tips of the wing portions. The self resonance frequency of the coil also varies depending upon the electrostatic capacity between the wing portions. Therefore, if a plurality of dielectric plates 100 having different dielectric constants $\epsilon$ are prepared and are selectively used, then any resonance frequency can be obtained by a one-touch operation. FIG. 6 is a graph which shows a concrete example, and wherein the abscissa represents the dielectric constant $\epsilon$ of the filling material and the ordinate represents the resonance frequency $F_0$. When the filling material is the air (dielectric constant:1), the resonance frequency $F_0$ is 101 MHz. When the filling material consists of a polyethylene tetrafluoride resin (dielectric constant:3), the resonance frequency $F_0$ decreases to 73 MHz which is about 70% of the resonance frequency of when the dielectric constant is 1. As shown in FIG. 7, furthermore, it is also allowable to adjust the resonance frequency $F_0$ by sliding, in the direction of arrows, the dielectric plate 100 that is filled in the gap where the electrostatic capacity is formed.

I claim:

1. A high-frequency coil for nuclear magnetic imaging comprising:
   an even number of outer conductors that are provided with at least one set of opposing positions on a cylindrical surface having a center axis, each of said conductors having a central band portion in parallel with the center axis of the cylindrical surface and having at least two wing portions each with a tip, said wing portions extending from both end parts of a side edge of said central band portion;
   first and second ring-like inner conductors on the inside of said wing portions of said outer conductors and capacity-coupled to said even number of outer conductors, respectively, said inner conductors having a width different from the width of said wing portions; and
   neighboring tips of said wing portions being opposed to each other and separated via an air gap with a dielectric means having a desired dielectric constant, said dielectric means being insertable in said air gap.

2. A high-frequency coil for nuclear magnetic imaging comprising:
   an even number of outer conductors that are provided with at least one set of opposing positions on a cylindrical surface having a center axis, each of said conductors having a central band portion in parallel with the center axis of the cylindrical surface and having at least two wing portions that extend from both end parts of a side edge of said central band portion;
   first and second ring-like inner conductors on the inside of said wind portions of said outer conductors and capacitively coupled to said even number of outer conductors, said inner conductors having a width different from the width of said wing portions;
   neighboring tips of said wing portions positioned to be opposed to each other via an air gap; and
   a dielectric plate slidably insertable in said air gap for adjusting a self resonance frequency of said coil depending upon the inserted position thereof.

* * * * *